(12) United States Patent
Freimann et al.

(10) Patent No.: US 7,508,488 B2
(45) Date of Patent: Mar. 24, 2009

(54) PROJECTION EXPOSURE SYSTEM AND METHOD OF MANUFACTURING A MINIATURIZED DEVICE

(75) Inventors: Rolf Freimann, Aalen (DE); Ulrich Wagemann, Aalen (DE)

(73) Assignee: Carl Zeiss SMT AG, Oberkochen (DE)

( * ) Notice: Subject to any disclaimer, the term of this patent is extended or adjusted under 35 U.S.C. 154(b) by 547 days.

(21) Appl. No.: 11/248,279

(22) Filed: Oct. 13, 2005

(65) Prior Publication Data

US 2006/0098210 A1 May 11, 2006

Related U.S. Application Data

(60) Provisional application No. 60/617,641, filed on Oct. 13, 2004.

(51) Int. Cl.
*G03B 27/42* (2006.01)
(52) U.S. Cl. .......................................... 355/53; 355/75
(58) Field of Classification Search ................... 355/53, 355/75
See application file for complete search history.

(56) References Cited

U.S. PATENT DOCUMENTS

| | | | |
|---|---|---|---|
| 4,450,358 A | 5/1984 | Reynolds | |
| 4,872,755 A | 10/1989 | Kuchel | |
| 5,094,536 A | 3/1992 | MacDonald et al. | |
| 5,136,413 A | 8/1992 | MacDonald et al. | |
| 5,142,132 A | 8/1992 | MacDonald et al. | |
| 5,392,119 A | 2/1995 | McArthur et al. | |
| 5,710,620 A | 1/1998 | Taniguchi | |
| 5,815,268 A | 9/1998 | LaFleur | |
| 5,898,501 A | 4/1999 | Suzuki et al. | |
| 5,926,257 A | 7/1999 | Mizouchi | |
| 6,285,443 B1 | 9/2001 | Wangler et al. | |
| 6,614,535 B1 | 9/2003 | Kakuchi et al. | |
| 6,633,362 B2 | 10/2003 | Murakami et al. | |
| 6,891,596 B2 | 5/2005 | Rostalski et al. | |
| 7,068,350 B2 * | 6/2006 | Nishi et al. ................... 355/53 |
| 2002/0001088 A1 | 1/2002 | Wegmann et al. | |
| 2002/0101892 A1 | 8/2002 | Ouchi | |

(Continued)

FOREIGN PATENT DOCUMENTS

DE 101 09 929 A1 11/2001

(Continued)

OTHER PUBLICATIONS

U.S. Appl. No. 60/666,175, filed Mar. 30, 2005, Altenberger et al.

(Continued)

*Primary Examiner*—Kiet T Nguyen
(74) *Attorney, Agent, or Firm*—Jones Day

(57) ABSTRACT

A projection exposure system and method of manufacturing a miniaturized device using the projecting exposure system uses an imaging of a patterning structure onto a substrate using a projection optical system. Measuring light is directed through the projection optical system to be incident on the substrate and measuring light reflected from the substrate is superimposed with reference light to generate an interference pattern. The interference pattern is analyzed to determine imaging properties of the projecting optical system. Actuators of the projection optical system may be used to improve the imaging characteristics.

19 Claims, 4 Drawing Sheets

U.S. PATENT DOCUMENTS

| | | |
|---|---|---|
| 2003/0007253 A1 | 1/2003 | Schuster et al. |
| 2003/0128346 A1 | 7/2003 | Murakami et al. |
| 2003/0160969 A1 | 8/2003 | Endo et al. |
| 2005/0008870 A1 | 1/2005 | McGuire, Jr. |
| 2005/0141098 A1 | 6/2005 | Schuster |

FOREIGN PATENT DOCUMENTS

| | | |
|---|---|---|
| EP | 0 281 906 B1 | 9/1988 |
| EP | 0 814 331 A2 | 12/1997 |
| EP | 1 231 514 A1 | 8/2002 |
| EP | 1 231 517 A1 | 8/2002 |
| JP | 2002-151388 A | 5/2002 |
| JP | 2003-083846 A | 3/2003 |
| JP | 2003-185409 A | 7/2003 |
| JP | 2003-185503 A | 7/2003 |
| WO | WO 01/075394 A1 | 10/2001 |
| WO | WO 03/067182 A1 | 8/2003 |
| WO | WO 03/075049 A2 | 9/2003 |
| WO | WO 03/077036 A1 | 9/2003 |
| WO | WO 03/077037 A1 | 9/2003 |

OTHER PUBLICATIONS

K. Freischlad et al., "A Dual-Wavelength Interferometer for Testing Projection Lenses", SPIE vol. 2240 (1994), pp. 743 to 749.

D.G. Flagello et al., "The Influence of Lens Aberrations in Lithography", Microlithography World, Winter 1998, pp. 11 to 20.

K. Rebitz et al., "Characterizing Exposure Tool Optics in the Fab", Microlithography World, Summer 1999, pp. 10 et. seq. (4 pages).

* cited by examiner

PROJECTION EXPOSURE SYSTEM AND METHOD OF MANUFACTURING A MINIATURIZED DEVICE

This application claims the benefit of U.S. Provisional Patent Application No. 60/617,641 filed Oct. 13, 2004, the entire contents of which are incorporated herein by reference.

BACKGROUND OF THE INVENTION

1. Field of the Invention

The present invention relates to a projection exposure system which may be used in a method of manufacturing miniaturized devices and to a corresponding method.

2. Brief Description of Related Art

Lithographic processes are commonly used in the manufacture of miniaturized structures such as integrated circuits, liquid crystal elements, micro-patterned structures and micro-mechanical components.

A projection exposure apparatus used for photolithography generally comprises a projection optical system for imaging a patterning structure, commonly referred to as a reticle, onto a substrate commonly comprising a semiconductor wafer and a photo-sensitive layer, commonly referred to as a resist, which is exposed with the image of the patterning structure using imaging light. The imaging light is generated by an illuminating optical system illuminating the patterning structure.

The trend to produce even smaller and more sophisticated miniaturized devices places increasingly high demands on the projection exposure system. In particular, an optical performance of this system has to be maintained during the exposure process, such as subsequent exposures of plural dies on the wafer. The quality of the optical imaging may be controlled by exposing a resist-coated wafer with a predetermined test pattern, developing the resist and detecting the developed resist pattern by using a microscope such as a scanning-electron microscope. Deficiencies in the detected pattern may be analyzed and optical components of the projection exposure system may then be adjusted to obtain a desired imaging performance of the system. Such process is complicated and takes too much time to be used frequently in the manufacture of miniaturized devices.

From US 2003/0128346 A1, which is cited based upon preliminary understanding and without any formal admission of prior art, there is known a projection exposure system which allows to verify some characteristics of the optical performance without analyzing an exposed and developed test pattern. The system comprises a Fizeau interferometer including a Fizeau lens which may be inserted in a beam path of the imaging light upstream of the reticle. A wafer stage has a retro-reflector incorporated therein, wherein the retro-reflector is disposed adjacent to the wafer to be exposed and mounted on the wafer stage. For testing the optical performance of the projection optical system, measuring light is directed through the Fizeau lens and the projection optical system to be incident on the retro-reflector. The measuring light reflected from the retro-reflector travels back through the projection optical system and the Fizeau lens to be superimposed with measuring light reflected from the Fizeau lens to generate an interference pattern which is detected by a detector. The interference pattern is indicative of the optical performance of the system.

Since the wafer-stage has to be displaced by such an amount that the wafer is moved to the outside of the field of view of the projection optical system and that the retro-reflector is positioned within the field of view, a significant interruption of the exposure process is necessary to determine characteristics of the imaging quality with the conventional system. Moreover, the conventional system is difficult to be applied to immersion-type projection exposure systems having an immersion liquid disposed between the wafer surface and a front lens of the projection optical system.

SUMMARY OF THE INVENTION

The present invention has been accomplished taking the above problems into consideration.

It is an object of the present invention to provide a projection exposure system allowing to determine characteristics of an imaging performance.

It is a further object of the present invention to provide an improved method of manufacture of miniaturized devices wherein an imaging performance is maintained during consecutive exposures.

It is a further object of the present invention to provide a method of testing an optical performance of a projection exposure system.

Furthermore, it is an object of the present invention to provide such system and method which is applicable to immersion-type projection exposure systems In order to achieve the above object, the present invention provides a projection exposure system for imaging a patterning structure onto a substrate using a projection optical system, wherein measuring light is directed through the projection optical system to be incident onto the substrate. Measuring light reflected from the substrate is detected for determining characteristics of the imaging performance.

The inventors have found that measuring light reflected from the substrate, such as a wafer coated with resist, has a sufficient intensity to be detected and analyzed for determining characteristics of the imaging performance. Provision of a separate retro-reflector is not necessary. The substrate may comprise a photosensitive layer, and the measuring light may be reflected from a surface of the photosensitive layer and/or from an interface formed between the photosensitive layer and a substrate base underlying the photosensitive layer.

According to an exemplary embodiment of the invention, the determination of the optical characteristics is performed in between two subsequent exposure steps, such as between exposing a first die on a wafer and exposing a second die on the wafer. The measuring light may be directed onto the wafer in a region of the first die, the second die, or a region adjacent to both the first and second dies.

According to an exemplary embodiment of the invention, an analysis of the measuring light reflected from the substrate is based on an interferometric method referred to as white light interferometry in the art. White light interferometry uses measuring light having a coherence length which is substantially shorter than an optical path difference experienced by two interfering light beams. Herein, one of the interfering beams may be a beam reflected from the patterning structure, and the other interfering beam may be a beam reflected from the substrate. An optical path difference between the two beams is substantially twice an optical path between the patterning structure and the substrate, and the coherence length of the measuring light is shorter than that optical path difference. If the optical path difference between the two beams is exactly twice the optical path between the patterning structure and the substrate, a detected interference signal is maximum, according to the principles of white light interferometry. If the optical path difference between the two beams differs from exactly twice the optical path between the patterning structure and the substrate by an amount which is within a range of less than two to five times the coherence length of the measuring light, the interference signal is less than the maximum signal, but it is still possible to derive suitable measurement information from the measurement. If the difference between the optical path difference between the two beams and twice the optical path between the patterning structure and the substrate becomes larger than two to five times the coherence length of the measuring light, it will be difficult to detect a meaningful interference pattern in practice. Thus, for successfully operating the illustrated projection exposure system, it is helpful to adjust the optical delay system such that the optical path difference between the two beams is substantially twice the optical path between the patterning structure and the substrate, i.e. a difference between the optical path difference between the two beams and twice the optical path between the patterning structure and the substrate is sufficiently small such that the resulting interference pattern has a sufficient contrast or modulation allowing a meaningful analysis thereof.

According to an exemplary embodiment of the invention, a reference surface is provided by the patterning structure or a surface of a substrate on which the patterning structure is provided.

According to a particular embodiment of the invention, the projection optical system is of a liquid-immersion type, wherein immersion liquid is provided in a space between the surface of the substrate and a front lens of the projection optical system closest to the substrate. However, the invention is not limited thereto and may also be applied to projection optical systems where a gas is provided in the space between the front lens and the substrate.

According to an exemplary embodiment of the present invention, the projection exposure system comprises an illumination optical system for generating imaging light used for imaging the patterning structure onto the substrate. The system further comprises a mirror for superimposing a beam path of the measuring light with a beam path of the imaging light.

According to an exemplary embodiment herein, the mirror is removable from the beam path of the imaging light, such that exposure steps using the imaging light may be performed when the mirror is not disposed in the beam path, and the mirror may be disposed in the beam path for determining a characteristic of the imaging performance.

According to an exemplary embodiment, the imaging light and the measuring light have substantially the same wavelengths such that the characteristics of the projection optical system determined by using the measuring light are well indicative of the characteristics which the projection optical system has for the imaging light.

According to an exemplary embodiment, a white light interferometer comprises an optical delay system providing first and second beam paths, wherein an optical path length difference of the first and second beam paths substantially corresponds to two times an optical path difference between the substrate and reference surface.

According to a further exemplary embodiment, the projection exposure system comprises at least one actuator for adjusting the imaging performance, and the at least one actuator is controlled in dependence of the imaging characteristics determined using the measuring light. The actuator may comprise an actuator for positioning optical elements or groups of optical elements of the projection optical system relative to each other, an actuator for positioning the patterning structure relative to the projection optical system, an actuator for positioning the substrate relative to the projection optical system, an actuator for positioning components or groups of components of the illumination optical system relative to each other, and an actuator for positioning components or groups of components of the illumination optical system relative to components of the projection optical system. Within the context of the present invention, the term positioning means adjusting and positioning of an element by translating and/or rotating the element relative to another element.

BRIEF DESCRIPTION OF THE DRAWINGS

The foregoing as well as other advantageous features of the invention will be more apparent from the following detailed description of exemplary embodiments of the invention with reference to the accompanying drawings. It is noted that not all possible embodiments of the present invention necessarily exhibit each and every, or any, of the advantages identified herein.

DETAILED DESCRIPTION OF EXEMPLARY EMBODIMENTS

Figure 1:
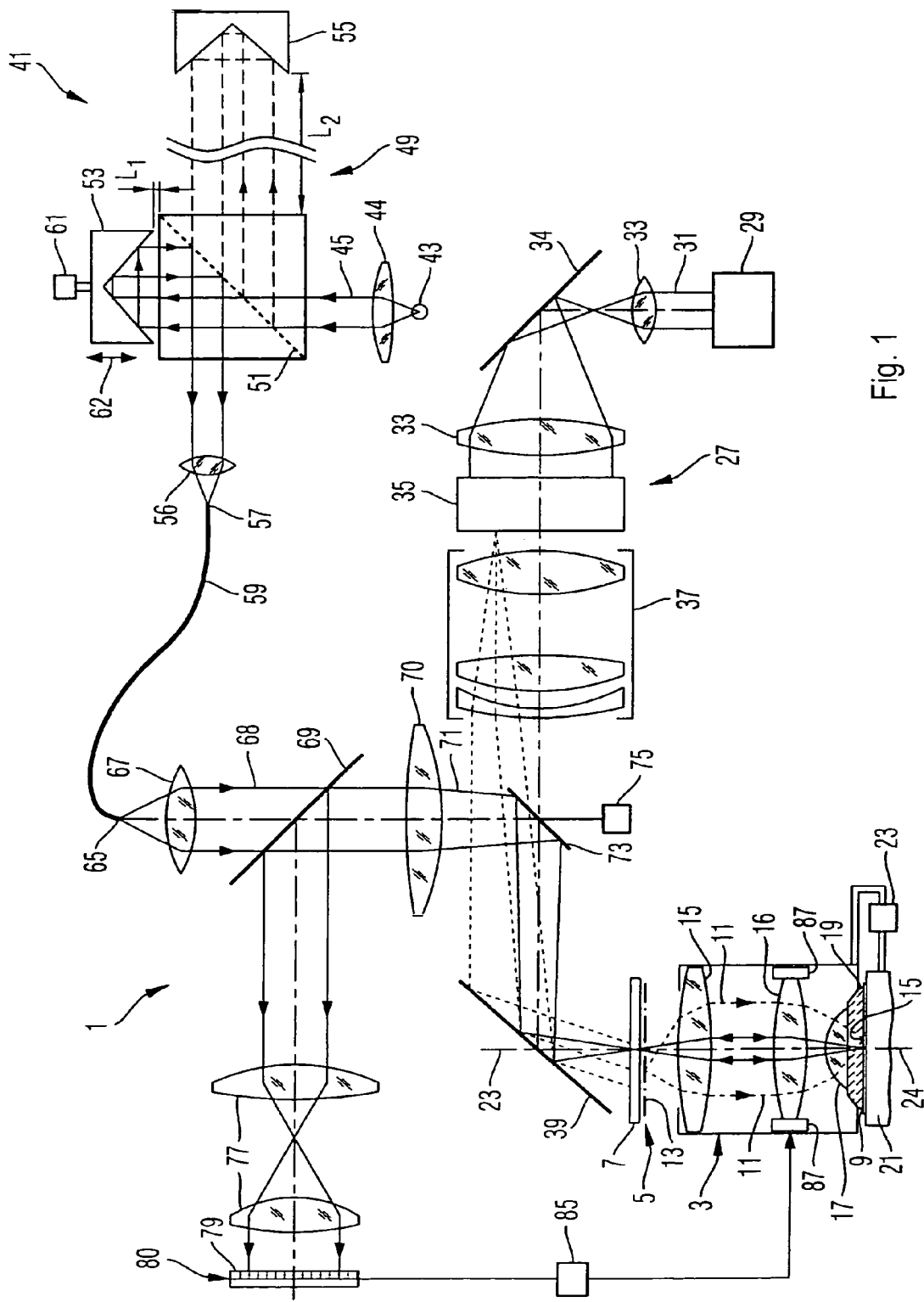
FIG. 1 is a schematic representation of an exemplary embodiment of a projection exposure system according to the present invention.

In the exemplary embodiments described below, components that are alike in function and structure are designated as far as possible by alike reference numerals. Therefore, to understand the features of the individual components of a specific embodiment, the descriptions of other embodiments and of the summary of the invention should be referred to.

FIG. 1 schematically illustrates a projection exposure system 1. The projection exposure system 1 comprises a projection optical system 3 for imaging a patterning structure 5 provided on or in a support 7 (hereinafter referred to as reticle 7) onto a wafer 9. The patterning structure 5 can be any suitable structure, such as a patterned layer on a glass or other suitable support, a phase mask or other type of structure. The patterning structure 5 is disposed in an object plane of the projection optical system 3, and a surface of the wafer 9 is disposed in an image plane of the projection optical system 3. Dotted lines 11 are exemplary representations of rays of imaging light imaging a location 13 of the object plane into a location 15 of the image plane.

FIG. 1 shows a very schematic representation of the projection optical system 3 by indicating only three lenses 15, 16 and 17. In practice, projection optical system 3 may comprise a higher number of lenses, a plurality of mirrors, and a combination of lenses and mirrors. The projection optical system 3 of the illustrated example is of a liquid-immersion type wherein an immersion liquid 19 is disposed in a space between the surface of the wafer 9 and front lens 17 of the projection optical system 3. Details of an example of the immersion-type projection optical system are disclosed in WO 2003/077037 A1, which document is incorporated herein by reference. However, the invention is not limited to immersion-type projection optical systems. Examples of other types of projection optical systems are known from US 2003/0007253 A1, WO 2003/075049 A2 and WO 2003/077036 A1, which documents are incorporated herein by reference.

The wafer is covered with a resist-layer which is developed after exposure with the image of the patterning structure 5. The wafer 9 is mounted on a wafer stage 21. An actuator 23 is provided for positioning the wafer 9 relative to the projection optical system 3. In particular, the actuator 23 comprises an actuator for changing a focal state of the imaging by changing a distance of the wafer 9 from the front lens 17 in a direction along an optical axis 24 of the projection optical system 3, and actuators for translating the wafer 9 in directions transverse to the optical axis 24 for changing the field of exposure on the wafer. For example, the exposure of the wafer 9 may be performed according to a conventional stepping or scanning process.

Similarly, also the reticle 7 is mounted on a reticle stage (not shown in FIG. 1) and having actuators associated therewith (also not shown in FIG. 1), for positioning the reticle 7 relative to the projection optical system 3.

The exposure of the wafer 9 is performed with imaging light generated by an illumination optical system 27 comprising an imaging light source 29 such as an excimer laser, for example a high power KrF excimer laser emitting light pulses of a wavelength of about 248 nanometers with a high repetition rate. A light beam 31 emitted from light source 29 is collimated by collimators 33 and deflected by a mirror 34, traverses an optical integrator 35 and a collimating lens arrangement 37 to be reflected from a mirror 39 to illuminate the patterning structure 5. The illuminating optical system 27 is only schematically illustrated in FIG. 1. The illuminating optical system 27 may be of a conventional type as it is known for example from U.S. Pat. No. 6,285,443 B1, U.S. Pat. No. 5,926,257 and U.S. Pat. No. 5,710,620, which documents are incorporated herein by reference.

The projection exposure system 1 further comprises a white light interferometer 41. The interferometer 41 comprises a measuring light source 43 and a collimator 44 to generate a beam 45 of measuring light having a relatively short coherence length which may be in a range of about 10 μm to about 500 μm. Preferably, the wavelength of the measuring light is relatively close to the wavelength of the imaging light. According to one exemplary embodiment, the measuring light source 43 comprises a tabletop excimer laser having a same or similar laser medium, such as KrF, as the imaging light source 29. Compared to the imaging light source 29, measuring light source 43 has a lower power and repetition rate. Still, while their wavelengths are not exactly the same within an available measuring accuracy, they are sufficiently close to each other such that the measuring light and the imaging light experience similar refractive indices of the lenses used in the optical system. Thus, rays of measuring light and corresponding rays of imaging light traverse the projection optical system along substantially the same paths. A suitable tabletop excimer laser is available under the trade name BraggStar Industrial from TUI Laser AG, Germering, Germany.

The measuring light beam 45 traverses an optical delay system 49 comprising a beam splitter 51 and retro-reflectors 53 and 55. A first portion of beam 45 traversing the beam splitter 51 is reflected from retro-reflector 53, reflected from beam splitter 51 and focused by a lens 56 onto an entrance face 57 of an optical fiber 59. A second portion of beam 45 reflected from beam splitter 51 is reflected by retro-reflector 55 and traverses beam splitter 51 such that it is superimposed with the first portion of beam 45 traversing the beam splitter 51 such that it is also focused by the lens 56 to be coupled into the optical fiber 59. The optical delay system 49 provides a first beam path for the first portion of beam 45 and a second beam path of the second portion of beam 45. The optical path length of the first and second beam paths are different. As schematically indicated in FIG. 1, the optical path difference is 2×(L2−L1). An actuator 61 is provided for changing the optical path length of the first beam path as indicated by an arrow 62.

The measuring light having traversed the optical delay system 49 is emitted from an exit end 65 of optical fiber 59, collimated by a collimating lens 67 to form a parallel beam 68 of measuring light. Wavefronts of the light forming the parallel beam 68 have a substantially flat shape. The beam 68 traverses a semi-transparent mirror 69 and is collimated by a collimating lens 70 to form a converging beam 71 of measuring light which is focused in the object plane of the projection optical system 3 where the patterning structure 5 is formed. Wavefronts of the converging beam 71 have a substantially spherical shape having the focus in the object plane as a center.

The beam path of beam 71 is superimposed with a beam path of the imaging light by a displaceable mirror 73. Mirror 73 is controlled by an actuator 75 for moving the mirror 73 into and out of the beam path of the imaging light. When the mirror 73 is disposed in the beam path of the imaging light, the converging beam 71 of measuring light is reflected from mirror 73 and mirror 39 such that the measuring light illuminates a location on the patterning structure 5. The portion of the measuring light is reflected from the surface of substrate 7 carrying the patterning structure 5 and travels back to be reflected from mirror 39 and mirror 73, is then collimated by lens 70 and reflected from the semi-transparent mirror 69. The portion of the measuring light reflected from reticle 7 and from semi-transparent mirror 69 traverses an imaging optics 77 to be incident on a radiation-sensitive surface 79 of a detector 80, such as a CCD detector. Wavefronts of the portion of the measuring light reflected from the reticle have a substantially spherical shape.

The portion of the measuring light traversing patterning structure 5 has substantially spherical wavefronts where it enters the projection optical system 3. The projection optical system 3 generates a second focus of the measuring light on the surface of wafer 9. A portion of the measuring light incident onto the wafer 9 is reflected therefrom, and the wavefronts of the measuring light reflected from the wafer are substantially spherical wavefronts. These wavefronts traverse the projection optical system 3 to be focused in the object plane of the projection optical system 3 and traverse the reticle 7 to be superimposed with that portion of the measuring light which is reflected from reticle 7. When the projection optical system 3 is of a perfect configuration, the wavefronts of the measuring light traversing the reticle 7 will be of a substantially spherical shape. Deviations of such spherical shape are indicative of distortions of the imaging performance caused by the projection optical system 3. Since the measuring light having traversed the projection optical system 3 is superimposed with the measuring light reflected from the reticle 7, an interference pattern will be formed on the radiation-sensitive surface 79 of detector 80. The optical path difference generated by the optical delay system 49 corresponds to two times the optical path between the location where the focus of the measuring light is formed on reticle 7 and the location to which that focus is imaged on the wafer by the projection optical system 3. The thus-formed interference pattern is indicative of wavefront distortions generated by the projection optical system. The image of the interference pattern detected by detector 80 is supplied to a controller 85 which analyzes the interference pattern to determine characteristics of the imaging performance of projection optical system 3. Such imaging characteristics may comprise an aberration value.

The projection optical system comprises an actuator 87, such as a piezo-electric actuator, for positioning lens 16 relative to other components of the projection optical system such as lenses 15 and 17. The actuator 87 is controlled by the controller 85 such that the measured aberration value is reduced and preferably eliminated. The above-mentioned aberration value and the actuators 87 are to be considered as examples for imaging characteristics which may be determined by the analysis of the interference pattern. A projection optical system may comprise alternative or additional actuators for changing relative positions of optical components. Further, the controller 85 may also control actuator 23 for positioning the wafer 9 relative to the projection optical system 3. Further, the controller 85 may also control an actuator (not shown in FIG. 1) for positioning the reticle 5 relative to the projection optical system 3. Further, actuators may be provided in the illumination optical system 27 to compensate for imaging deficiencies of the projection optical system 3, such as a telecentric error of the imaging.

According to an example, interference patterns are repeatedly recorded after suitable time intervals, which may be predetermined time intervals or time intervals chosen in accordance with a particular application, such as a number of exposed wafers. A time development or change in the subsequent interference patterns is analyzed for determining drifts of optical properties of the projection exposure system. Such analysis is helpful in deciding on additional steps which may be performed to improve the optical characteristics of the exposure system. Apart from controlling suitable actuators, such additional steps may comprise replacement of optical elements, adjusting of optical elements, maintenance of optical elements and others.

The mirror 73 may be positioned outside of the imaging beam during exposure of the wafer. It is possible to position the mirror 73 within the beam path of the imaging light at time intervals between subsequent exposure steps to perform the measurement of the imaging characteristics of the projection optical system. The detected interference patterns may be compared to the interference patterns detected at previous measurements to determine drifts or changes of the imaging characteristics and to control the corresponding actuators for compensating such drifts.

By translating the mirror 73 across the cross-section of the imaging beam path it is possible to focus the measuring light at different locations on the reticle 5 such that the imaging characteristics may be determined at plural locations within the field of view of the projection optical system.

It should be noted that a reflectivity of the surface of the wafer or the surface of the resist may be low. In immersion-type projection exposure system the reflectivity may be as low as 0.3%. However, even such low reflectivity is sufficient for detecting measuring light reflected from the wafer. If the reflectivity of the reticle for measuring light is assumed to be 3% and attenuation of the light by traversing the projection optical system is 50%, a ratio of intensities of the measuring light reflected from the reticle over the measuring light reflected from the wafer can have a value of about 10, for example. Even with such high differences in the intensities of the interfering light beams, a sufficient modulation of the interfering pattern may be generated to be able to determine imaging characteristics therefrom. Further, to improve a modulation of the interference pattern, such differences in intensities may be reduced by adjusting the intensities of the beam portions of the measuring light traversing the first and second beam paths of the optical delay system. This is possible by adjusting reflectivities of the beam splitters and retro-reflectors of the optical delay system, or by disposing suitable light attenuators in the first and second beam path of the optical delay system.

Figure 2:
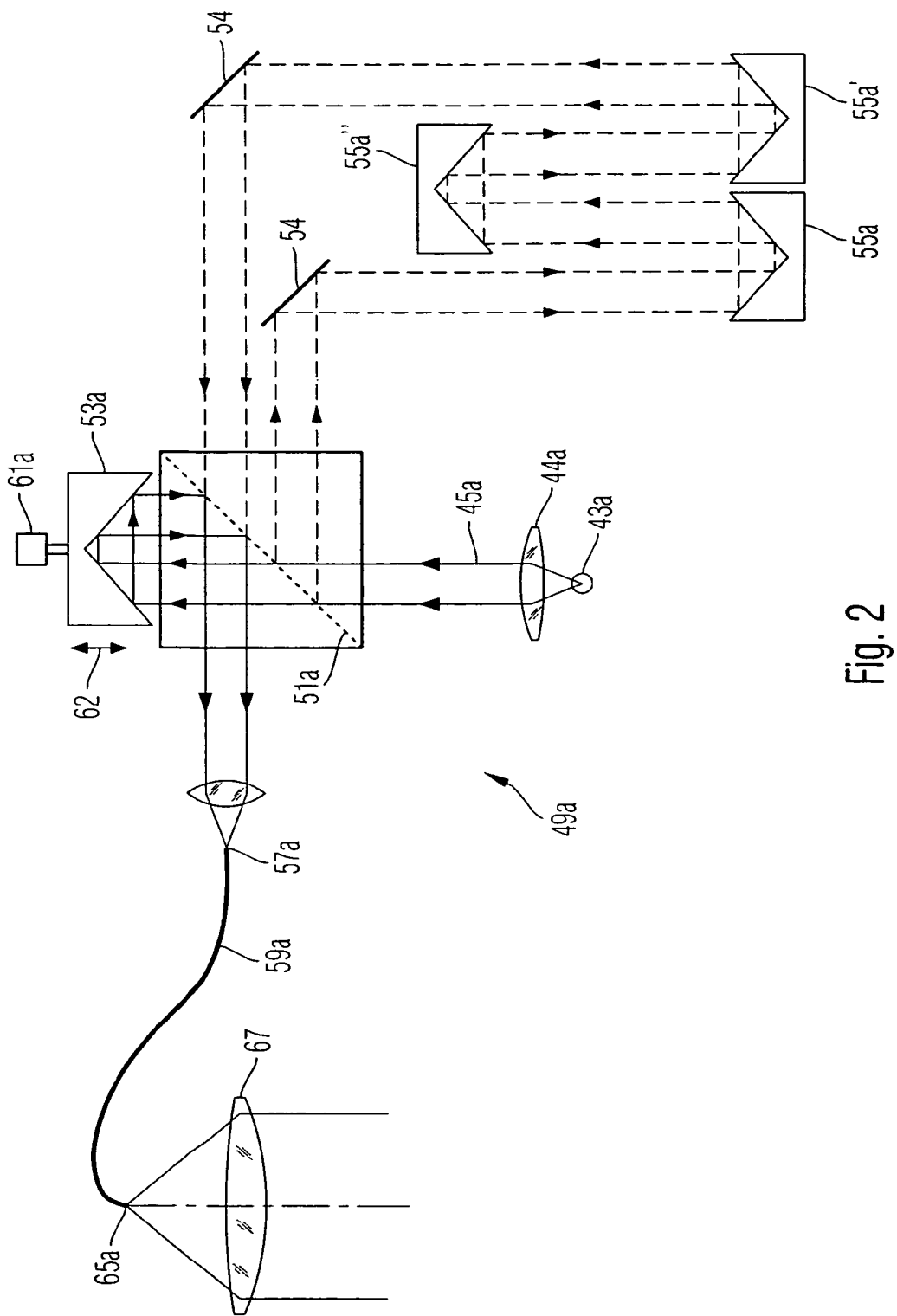
FIG. 2 is a schematic representation of an embodiment of an optical delay system which may be used in the projection exposure system.

FIG. 2 is a further example of an optical delay system 49a which may be used in the projection exposure system shown in FIG. 1. The configuration of optical delay system 49a is similar to that shown in FIG. 1, wherein the second beam path is provided by three retro-reflectors 55a, 55a' and 55a" and two reflecting mirrors 54 and 54' such that the second optical beam path is a folded beam path for increasing the optical path difference between the first and second beam paths.

Figure 3:
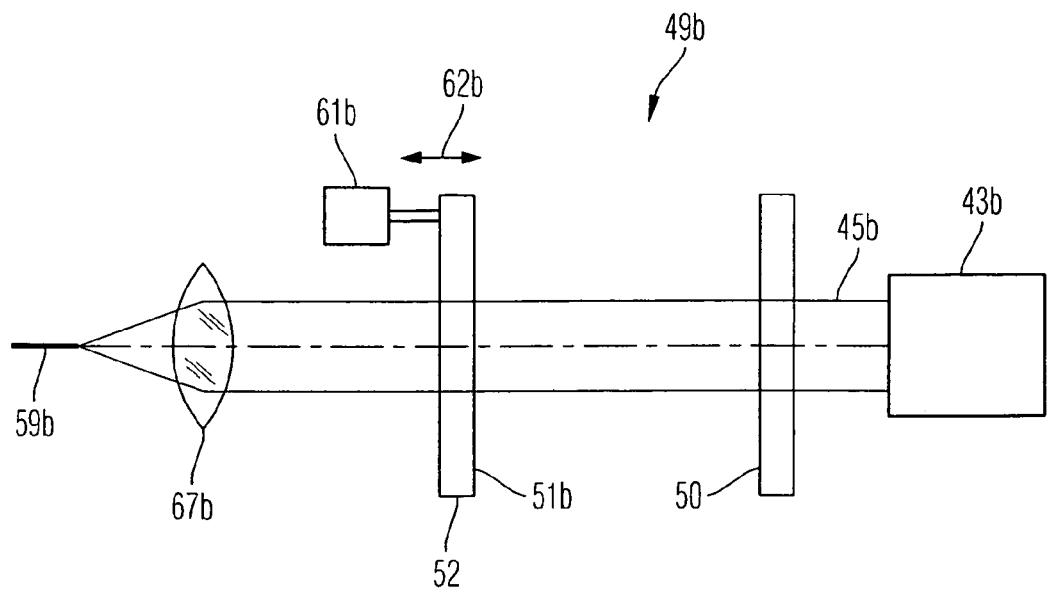
FIG. 3 is a schematic representation of a further embodiment of an optical delay system which may be used in the projection exposure system.

FIG. 3 shows a further example of an optical delay system 49b which may be used in the projection exposure system shown in FIG. 1. A beam 45b of measuring light generated by measuring light source 43b traverses a first semi-transparent mirror surface 50 and a second semi-transparent mirror surface 51b provided on a substrate 52. A portion of beam 45b traversing semi-transparent mirror 51b is focused by a lens 67b and coupled into an optical fiber 59b. A second portion of beam 45b reflected from semi-transparent mirror 51b travels back to be reflected from semi-transparent mirror 50. The reflected beam then traverses the semi-transparent mirror 51b to be coupled into optical fiber 59b. It appears that the optical delay system 49b generates an optical path difference corresponding to two times the distance between the transparent mirrors 50 and 51b. An actuator 61b is provided for displacing substrate 52 and changing the optical path difference as indicated by arrow 62b.

The optical delay system according to the present invention may be embodied according to a variety of configurations. For example, flat mirrors may be used rather than the retro-reflectors 53, 55 as shown in FIG. 1. Moreover, a grating rather than a beam splitter may be used for generating two beam portions from one beam. Further, optical fibers may be used for generating and guiding the separate light beams with the desired optical path differences. Therefore, the term optical delay system as used herein is intended to cover all configurations of optical systems providing adjustable optical path differences for a pair of beams.

Figure 5:
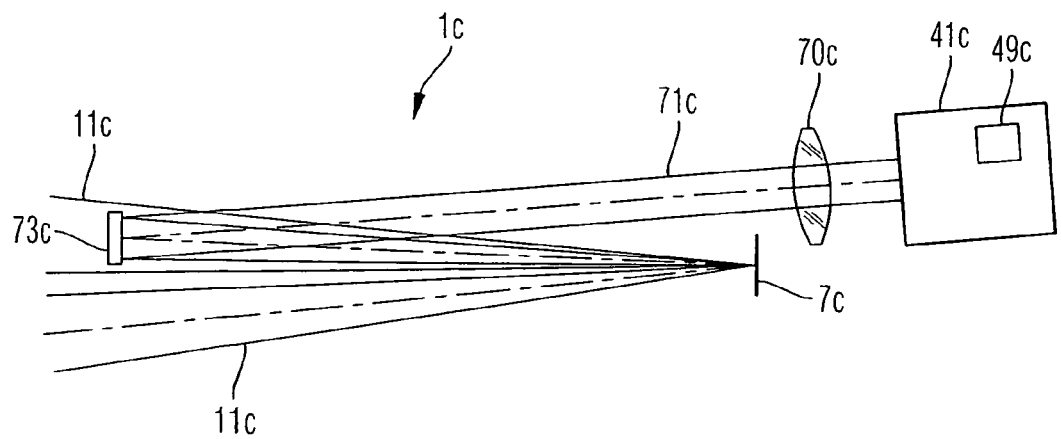
FIG. 5 is a detailed view of the projection exposure system shown in FIG. 4.
Figure 4:
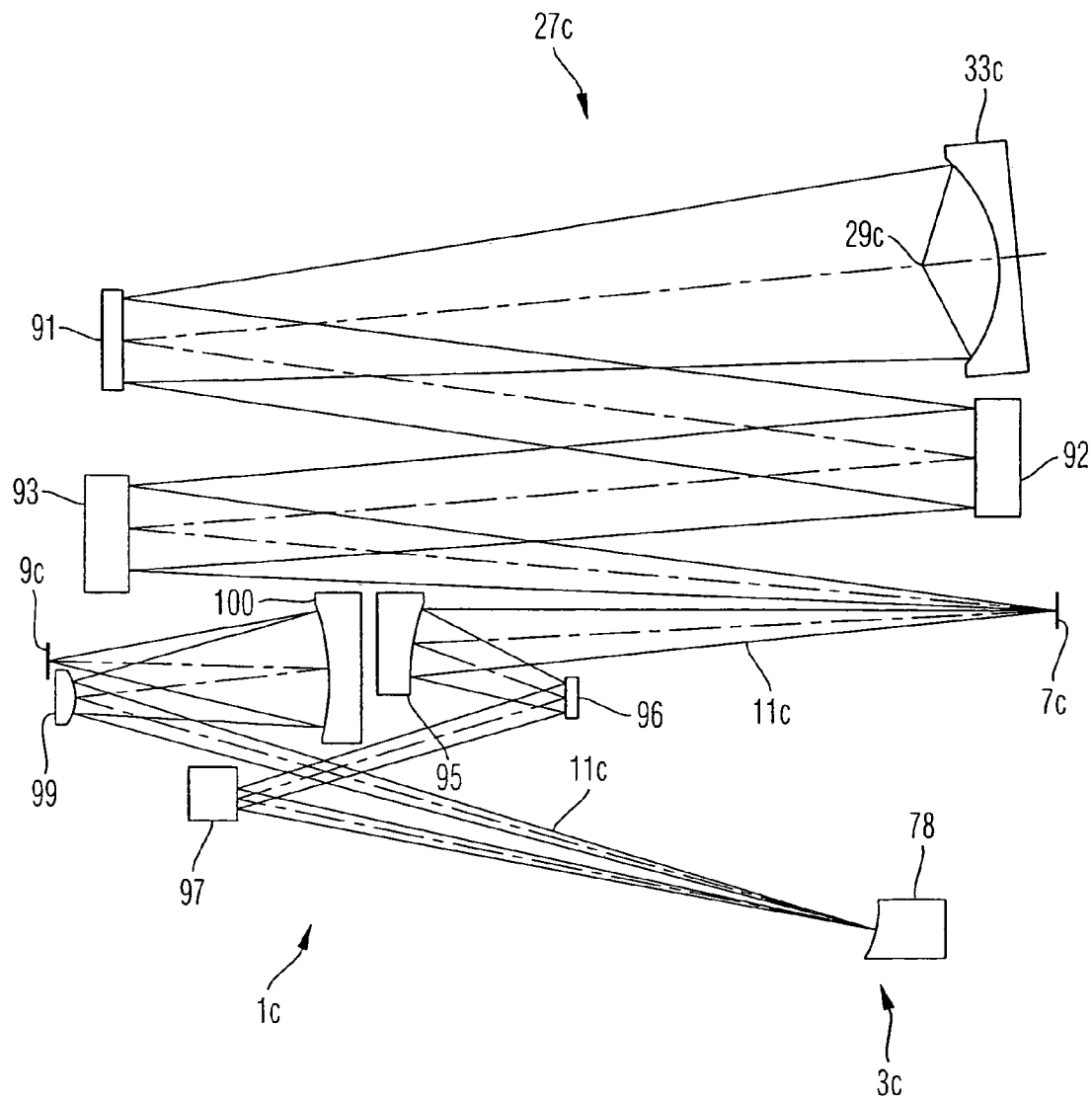
FIG. 4 is a schematic representation of a further exemplary embodiment of a projection exposure system according to the present invention.

FIGS. 4 and 5 show a further embodiment of a projection exposure system comprising a white light interferometer.

The projection exposure system 1c shown in FIG. 4 has a configuration similar to that disclosed in US 2005/0008870 A1 and uses extreme ultraviolet (EUV) light for imaging a pattern provided on a reticle 7c onto a wafer 9c. An illumination optical system 27c of the projection exposure system 1c comprises a EUV light source 29c generating imaging light which is collimated by a concave reflector 33c to form a beam 11c of imaging light and reflected from beam forming reflectors 91, 92 and 93 to be incident on the reticle 7c. The reflectors 33c, 71, 72 and 73 may have a beam shaping and radiance distribution shaping function to provide a desired angular distribution of the imaging light which is incident on the reticle 7c. A projection optical system 3c images the patterning structure provided on the reticle 7c onto the surface of the wafer 9c by reflecting the imaging light reflected from the patterning structure provided on the reticle 7c subsequently from mirrors 95, 96, 97, 98, 99 and 100 to be finally incident on the surface of the wafer 9c.

FIG. 5 is a schematic detailed view of the projection exposure system 1c shown in FIG. 4 to illustrate how a beam of measuring light 71c is coupled into a beam path of imaging light 11c of the projection exposure system 1c.

The white light interferometer 41c may have a configuration as illustrated above with reference to FIGS. 1 to 3 and is illustrated in FIG. 5 by a simplified box 41c. A beam of measuring light 71c is collimated by a lens 70c and incident on a mirror 73c disposed in the beam path of the imaging light 11c such that the measuring light 71c reflected off from the mirror is incident on the reticle 7c. The mirror 73c is displaceable such that it can be moved out of the beam path of the imaging light 11c at a time when the projection optical system 1c is used for exposing the wafer 9c with patterns provided on the reticle 7c using the imaging light 11c, and the mirror 73c can be moved into the beam path of the imaging light 11c for performing an interferometric measurement using the beam 71c of measuring light.

The measuring light can be of a wavelength greater than a wavelength of the EUV radiation used for the imaging. For example, the measuring light may have a wavelength of 632.8 nm generated by a helium neon laser.

A portion of the measuring light is reflected from a surface of the reticle 7c such that it is incident on the mirror 73c again to be reflected therefrom such that it enters the interferometer 41c as reference light. Another portion of the measuring light incident on the reticle 7c is reflected such that it coincides with the beam path of the imaging light. This portion of the measuring light reflected from the reticle 7c will be reflected from mirrors 95, 96, 97, 98, 99 and 100 to be incident on the surface of the wafer 9c. A portion of the measuring light incident on the wafer 9c will be reflected therefrom and travel back its way coinciding with the beam path of the imaging light, such that it is reflected from the mirrors 100, 99, 98, 97, 96 and 95 to be incident on the reticle 7c again. A portion of that light is reflected from the reticle 7c is incident on the mirror 73c and reflected off therefrom to enter the interferometer 41c as measuring light.

It is apparent that the measuring light entering the interferometer 41c has experienced, relative to the reference light entering the interferometer 41c, an optical delay corresponding to two times a length of the imaging beam path between the reticle 7c and the wafer 9c. For performing the interferometric measurement, an optical delay system 49c of the interferometer system 41c is adjusted such that it provides an optical path difference corresponding to two times the optical path length between the reticle 7c and the wafer 9c experienced by the measuring light.

By analyzing the generated inteferograms detected by a camera of the interferometer system 41c it is possible to determine imaging characteristics and changes over time of the imaging characteristics of the projection optical system 3c. Actuators of the projection exposure system 1c can then be controlled based on the analysis of the detected interference patterns for improving a performance of the projection exposure system. Such actuators may comprise actuators for controlling positions of optical elements of the projection exposure system 1c, such as positions of the reflectors 33c, 91, 92, 93, 95, 96, 97, 98, 99 and 100. The actuators may also comprise actuators for controlling a position of the reticle 7c and a position of the wafer 9c. Still further, the actuators may comprise actuators controlling a surface shape of some of the reflectors and mirrors by generating forces causing a deformation of the mirror surfaces.

In the above illustrated embodiments, the white light interferometer comprises an optical delay system disposed between the measuring light source and the projection optical system. According to other embodiments, it is possible to dispose the optical delay system in the beam path between the projection optical system and the detector of the white light interferometer.

In the above illustrated embodiments, separate light sources are used for imaging the patterning structure onto the substrate and for performing the interferometric measurement. It is, however, also conceivable to use a same light source for both the imaging of the patterning structure and the interferometric measurements, i.e. the imaging light and the measuring light can be derived from the same light source. The measuring light source may then comprise this same light source and suitable optics to provide the measuring light, and the imaging light source may comprise this same light source and suitable optics to provide the imaging light.

In the above illustrated embodiments, the detected imaging characteristics are used to control actuators for displacing optical components of the projection exposure system relative to other components thereof. According to other embodiments, it is possible to control actuators for changing a damping property of a vibration damper provided between components of the projection optical system. The interference patterns generated with the measuring light are then preferably analyzed in view of drifts or vibrations of the components of the projection optical system, and the actuators are then preferably controlled such that vibrations are minimized.

Embodiments of a projection exposure system and method of manufacturing a miniaturized device using the projecting exposure system perform an imaging of a patterning structure onto a substrate using a projection optical system. Measuring light is directed through the projection optical system to be incident on the substrate and measuring light reflected from the substrate is superimposed with reference light to generate an interference pattern. The interference pattern is analyzed to determine imaging properties of the projecting optical system or changes of such imaging properties over time. Actuators of the projection optical system may be used to improve the imaging properties or maintain imaging properties substantially constant over time.

While the invention has been described with respect to certain exemplary embodiments thereof, it is evident that many alternatives, modifications and variations will be apparent to those skilled in the art. Accordingly, the exemplary embodiments of the invention set forth herein are intended to be illustrative and not limiting in any way. Various changes may be made without departing from the spirit and scope of the present invention as defined in the following claims.

The invention claimed is:

1. A projection exposure system for imaging a structure onto a substrate, the projection exposure system comprising:
a projection optical system having an object plane and an image plane, wherein at least one first location in the object plane is imaged into a corresponding second location in the image plane, and wherein a first optical path length between the first location and the second location is of a first length;
a measuring light source for generating measuring light having a coherence length which is less than half of the first length;
an optical delay system providing a first beam path and a second beam path for light traversing the optical delay system, wherein a difference between an optical path length of the first beam path and an optical path length of the second beam path is adjustable and of a second length, wherein the second length is adjustable to be substantially equal to two times the first length; and
a detector for detecting a light intensity;
wherein the projection exposure system comprises an interferometer system including the measuring light source, the projection optical system, the optical delay system and the detector, wherein the measuring light source, the projection optical system, the optical delay system and the detector are arranged such that measuring light having traversed the projection optical system and measuring light having traversed the optical delay system is incident on the detector.

2. The projection exposure system according to claim 1, further comprising a substrate stage for mounting a substrate in a region of the image plane of the projection optical system; and wherein the measuring light source, the projection optical system, the optical delay system and the detector are arranged such that the measuring light having traversed the projection optical system is reflected from an interface provided by a substrate mounted on the substrate stage.

3. The projection exposure system according to claim 2, wherein the projection optical system comprises a front lens closest to the image plane, and wherein an immersion liquid is provided in a space between the front lens and a surface of the substrate.

4. The projection exposure system according to claim 2, wherein the substrate comprises a resist layer, and wherein the measuring light traversing the projection optical system is reflected from a surface of the resist layer.

5. The projection exposure system according to claim 1, further comprising a reticle stage for mounting a patterning structure in a region of the object plane of the projection optical system; and wherein measuring light reflected from an imaging structure mounted on the reticle stage and having traversed the optical delay system is incident on the detector.

6. The projection exposure system according to claim 1, further comprising an illumination optical system for generating imaging light traversing the object plane.

7. The projection exposure system according to claim 6, wherein the interferometer system further includes a mirror for superimposing a beam path of the measuring light traversing the projection optical system with a beam path of the imaging light, wherein the mirror is disposed upstream of the object plane in the beam path of the imaging light.

8. The projection exposure system according to claim 7, wherein the mirror is removable from the beam path of the imaging light.

9. The projection exposure system according to claim 8, wherein the illumination optical system is configured to intermittently generate the imaging light, wherein the interferometer system further comprises a first actuator configured to remove the mirror from the beam path and to position the mirror within the beam path of the imaging light, and wherein the projection exposure system further comprises a first controller configured to control the first actuator such that the mirror is removed from the beam path of the imaging light at time intervals where the imaging light is generated and such that the mirror is positioned within the beam path of the imaging light at at least one of the time intervals where the imaging light is not generated.

10. The projection exposure system according to claim 6, wherein the imaging light and the measuring light have substantially same wavelengths.

11. The projection exposure system according to claim 1, wherein the optical delay system comprises at least one light attenuator for reducing a light intensity of light in the first beam path relative to a light intensity of light in the second beam path.

12. The projection exposure system according to claim 1, wherein the projection optical system further comprises:

a mounting structure for at least one optical component thereof; and a second actuator configured to change a position of the optical component relative to the mounting structure; and wherein the projection exposure system further comprises a second controller configured to control the second actuator based on a signal generated by the detector.

13. The projection exposure system according to claim 12, wherein the second controller is further configured to control the second actuator based on variations over time of the signal generated by the detector.

14. The projection exposure system according to claim 1, wherein the projection exposure system further comprises:

a third actuator configured to change a position of the substrate relative to the projection optical system; and a third controller configured to control the second actuator based on a signal generated by the detector.

15. The projection exposure system according to claim 14, wherein the third controller is further configured to control the third actuator based on variations over time of the signal generated by the detector.

16. The projection exposure system according to claim 1, wherein the projection optical system comprises a plurality of lenses configured to provide an imaging beam path between the object plane and the image plane.

17. The projection exposure system according to claim 1, wherein the projection optical system comprises a plurality of mirrors configured to provide an imaging beam path between the object plane and the image plane.

18. A projection exposure system for imaging a patterning structure arrangeable in an object plane onto a light-sensitive substrate arrangeable in an image plane, wherein the optical path length between said object plane and said image plane is a first length, said projection exposure system comprising:

an optical system comprising a delay system, wherein the delay system is configured for:

splitting a light beam into at least two separate light beams having an optical path difference adjustable to a second length being substantially twice of said first length, and combining said two separate light beams to a measurement light; and wherein the optical system further comprises an interferometer system superimposing a first portion of said measurement light reflected from the image plane with a second portion of said measurement light reflected from the object plane.

19. A method for testing an optical performance of a projection exposure system, the projection exposure system being configured for imaging a patterning structure arrangeable in an object plane of the projection exposure system onto a light-sensitive substrate arrangeable in an image plane of the projection exposure system, wherein an optical path length between the object plane and the image plane is a first length, wherein the method comprises:

providing measurement light comprising at least a first light beam and a second light beam, wherein an optical path difference between said first light beam and said second light beam is adjustable to a second length that is substantially twice said first length; and superimposing a first portion of said measurement light reflected from the image plane with a second portion of said measurement light reflected from the object plane.

* * * * *